(12) United States Patent
Ichikawa et al.

(10) Patent No.: US 8,209,155 B2
(45) Date of Patent: Jun. 26, 2012

(54) SIMULATION METHOD AND SIMULATION PROGRAM

(75) Inventors: Takashi Ichikawa, Saitama-ken (JP); Naoki Tamaoki, Tokyo (JP); Toshiro Takase, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 816 days.

(21) Appl. No.: 12/192,179

(22) Filed: Aug. 15, 2008

(65) Prior Publication Data

US 2009/0055143 A1 Feb. 26, 2009

(30) Foreign Application Priority Data

Aug. 16, 2007 (JP) ................................. 2007-212418

(51) Int. Cl.
*G06F 7/60* (2006.01)
*G06F 17/10* (2006.01)

(52) U.S. Cl. .......................................................... 703/2
(58) Field of Classification Search .................. 703/2
See application file for complete search history.

(56) References Cited

U.S. PATENT DOCUMENTS

| 5,421,934 | A | * | 6/1995 | Misaka et al. ................. 216/59 |
| 5,926,402 | A | | 7/1999 | Tatsuta et al. |
| 2007/0118341 | A1 | | 5/2007 | Tamaoki et al. |

OTHER PUBLICATIONS

Mahorowala et al. "Etching of polysilicon in inductively coupled Cl2 and HBr discharges.II. Simulation of profile evolution using cellular representation of feature composition and Monte Carlo computation of flux and surface kinetics" 2002 American Vacuum Society.*

Kokkoris, et al., "Simulation of SiO₂ and Si feature etching for microelectronics and microelectromechanical systems fabrication: A combined simulator coupling modules of surface etching, local flux calculation, and profile evolution", J. Vac. Sci. Technol. A 22(4), pp. 1896-1902, (Jul./Aug. 2004).

Mahorowala, et al., "Etching of polysilicon in inductively coupled Cl₂ and HBr discharges. II. Simulation of profile evolution using celluar representation of feature compostition and Monte Carlo computation of flux and surface kinetics", J. Vac. Sci. Technol. B 20(3), pp. 1064-1076, May/Jun. 2002).

Abdollahi-Alibeik, et al., "Analytical modeling of silicon etch process in high density plasma", J. Vac. Sci. Technol. A 17(5), pp. 2485-2491, (Sep.-Oct. 1999).

U.S. Appl. No. 12/192,197, filed Aug. 15, 2008, to Ichikawa.

* cited by examiner

*Primary Examiner* — Saif Alhija
(74) *Attorney, Agent, or Firm* — Finnegan, Henderson, Farabow, Garrett & Dunner, L.L.P.

(57) ABSTRACT

A simulation method includes dividing a material surface into finite computational elements, and calculating a deposition rate or etching rate at each of the computational elements to simulate a feature profile of the material surface, the calculating including calculating an indirect effect of a first computational element on the deposition rate or etching rate of a second computational element. The calculating the indirect effect includes correcting a surface profile at the first computational element on the basis of a surface structure around the first computational element, and calculating the indirect effect on the basis of the corrected surface profile at the first computational element.

18 Claims, 9 Drawing Sheets

SIMULATION METHOD AND SIMULATION PROGRAM

CROSS-REFERENCE TO RELATED APPLICATIONS

This application is based upon and claims the benefit of priority from the prior Japanese Patent Application No. 2007-212418, filed on Aug. 16, 2007; the entire contents of which are incorporated herein by reference.

BACKGROUND OF THE INVENTION

1. Field of the Invention

This invention relates to a simulation method and a simulation program for simulating the feature profile of a material surface such as a semiconductor device.

2. Background Art

In the processing of a material surface using chemical vapor deposition and reactive ion etching, simulation of the feature profile is a necessary technique for sophisticated process control. Semiconductor manufacturing processes including fine processing require high accuracy in process controllability, and simulation also requires similar high accuracy.

Simulation of the feature profile of a material surface is typically performed by dividing the material surface in a microstructure into finite computational elements (such as points, segments, and polygons) and calculating the flux or surface growth rate at each computational element. There is a simulation method for determining the feature profile by dividing a material surface into finite computational elements, determining a local flux at each computational element, and calculating a surface growth rate for each time step based on a surface reaction model (e.g., G. Kokkoris, A. Tserepi, A. G. Boudouvis, and E. Gogolides, "Simulation of $SiO_2$ and Si feature etching for microelectronics and microelectromechanical systems fabrication", J. Vac. Sci. Technol. A 22, 1896 (2004)).

The feature profile evolution is performed by various techniques such as a technique based on the level set method (e.g., G. Kokkoris, A. Tserepi, A. G. Boudouvis, and E. Gogolides, "Simulation of $SiO_2$ and Si feature etching for microelectronics and microelectromechanical systems fabrication", J. Vac. Sci. Technol. A 22, 1896 (2004)), a technique based on the cell model (A. P. Mahorowala and H. H. Sawin, "Etching of polysilicon in inductively coupled $Cl_2$ and HBr discharges. II. Simulation of profile evolution using cellular representation of feature composition and Monte Carlo computation of flux and surface kinetics", J. Vac. Sci. Technol. B 20, 1064 (2002)), and a technique based on the string model. Any of these techniques is typically performed by dividing the material surface in a microstructure into finite computational elements (such as points, segments, and polygons) and determining the flux or surface growth rate at each computational element.

In the processing of a material surface, it is known that the feature profile is greatly affected by not only reactive species directly reaching the material surface from the vapor phase, but also by reactive species once brought into contact with another material and then indirectly reaching the material surface. Both experiments and simulations have shown that anomalous features called "microtrenches" are produced by ions reaching the material surface from the vapor phase and reflected thereon, as disclosed in, e.g., S. Abdollahi-Alibeik, J. P. McVittie, K. C. Saraswat, V. Sukharev, and P. Schoenborn, "Analytical modeling of silicon etch process in high density plasma", J. Vac. Sci. Technol. A 17, 2485 (1999). In the simulation of feature profiles described in this paper, the material surface in a microstructure is divided into finite computational elements, and the amount of ions reflected from one computational element to another is calculated on the basis of a reflection probability, which is defined before calculation and depends on the emission angle. Thus, anomalous features called microtrenches are represented.

However, use of techniques for representing the material surface by dividing it into finite computational elements (such as points, segments, and polygons) may introduce profile error. In particular, in calculating an indirect effect of one computational element on another (such as reflection and resputtering), finite division of the material surface induces error, which has the problem of greatly affecting the profile accuracy of the calculated result.

SUMMARY OF THE INVENTION

According to an aspect of the invention, there is provided a simulation method including: dividing a material surface into finite computational elements; and calculating a deposition rate or etching rate at each of the computational elements to simulate a feature profile of the material surface, the calculating including calculating an indirect effect of a first computational element on the deposition rate or etching rate of a second computational element, the calculating the indirect effect including: correcting a surface profile at the first computational element on the basis of a surface structure around the first computational element; and calculating the indirect effect on the basis of the corrected surface profile at the first computational element.

According to another aspect of the invention, there is provided a simulation method including: dividing a material surface into finite computational elements; and calculating a deposition rate or etching rate at each of the computational elements to simulate a feature profile of the material surface, the calculating including calculating an indirect effect on any of the deposition rate or etching rate of one computational element exerted by all the other computational elements, the calculating the indirect effect including: correcting a surface profile at the all the other computational elements on the basis of a surface structure around each of the all the other computational elements; and calculating the indirect effect for a plurality of reflections on the basis of the corrected surface profile at the all the other computational elements.

According to still another aspect of the invention, there is provided a simulation program configured to cause a computer to perform a simulation, the simulation including: dividing a material surface into finite computational elements; and calculating a deposition rate or etching rate at each of the computational elements to compute a feature profile of the material surface, the calculating including calculating an indirect effect of a first computational element on the deposition rate or etching rate of a second computational element, in calculating the indirect effect, the simulation program causing the computer to perform: correcting a surface profile at the first computational element on the basis of a surface structure around the first computational element; and calculating the indirect effect on the basis of the corrected surface profile at the first computational element.

DETAILED DESCRIPTION OF THE INVENTION

Figure 1:
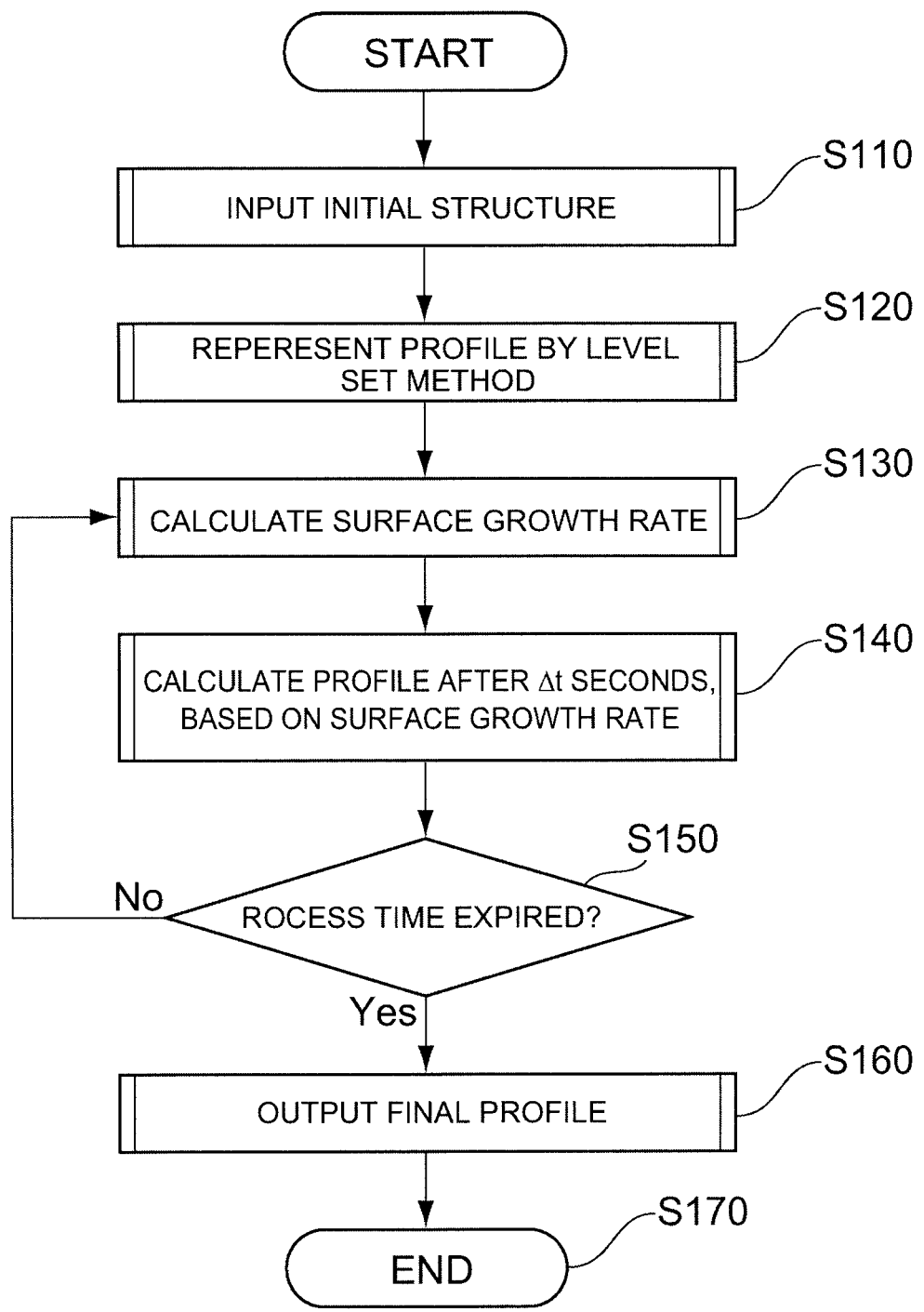
FIG. 1 is a flow chart showing the overall simulation of the feature profile of a semiconductor device according to a first embodiment of the invention.

Embodiments of the invention will now be described with reference to the drawings, in which like components are labeled with like reference numerals, and the detailed description thereof is omitted as appropriate.

FIG. 1 is a flow chart showing the overall simulation of the feature profile of a processed surface of a semiconductor device according to a first embodiment of the invention.

According to the embodiment, the material surface is dividing into finite computational elements. Then, a deposition rate or etching rate at each of the computational elements is calculated and a feature profile of the processed material surface is simulated. That is, the feature profile of the material surface corresponds to a combination of the surface profile of the computational elements.

First, an initial structure prior to processing is inputted (step S110). While various formats for input can be contemplated, this embodiment uses a technique of representing the material surface by a point sequence and reading it. Next, the inputted initial structure is used to create an initial level set function (step S120). Alternatively, a level set function can be directly inputted in step S110.

The level set function is now described.

Figure 2:
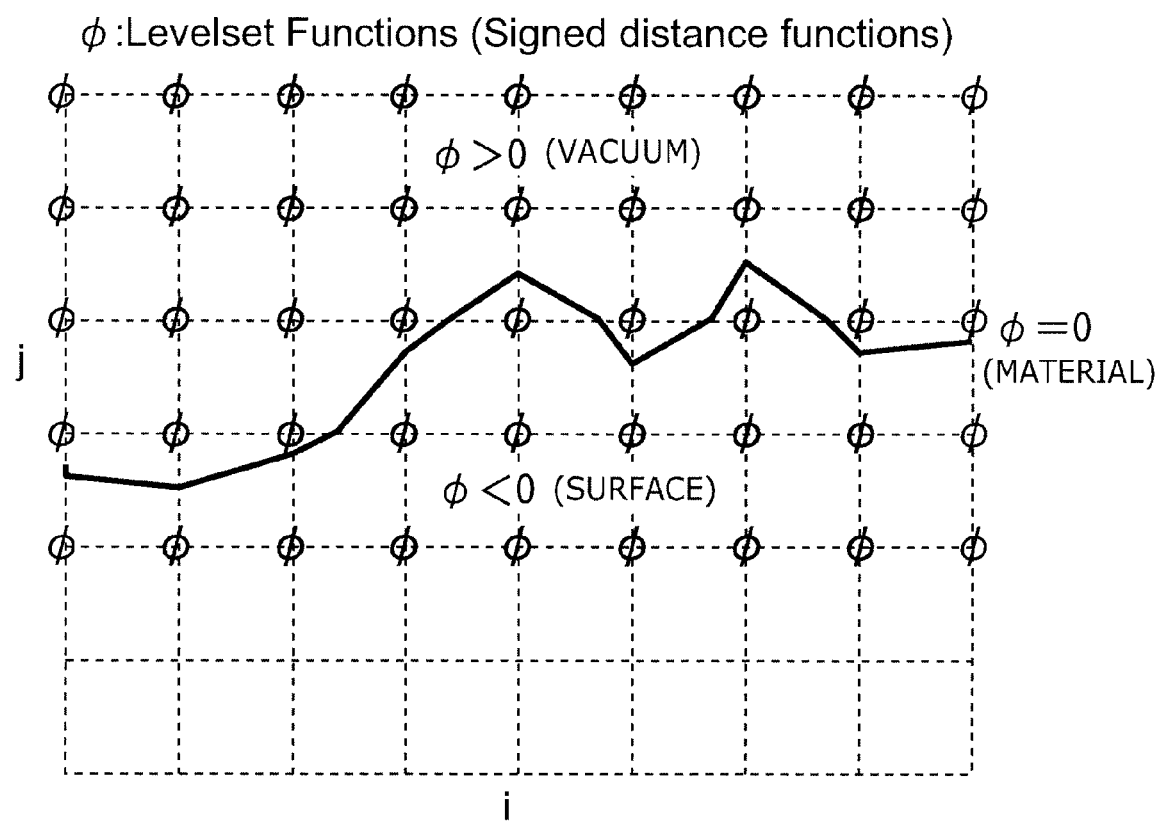
FIG. 2 is a schematic view for illustrating a level set function.

FIG. 2 is a schematic view for illustrating a level set function.

A level set function is defined using the distance from the material surface, and its value is saved on a mesh in the computational region. On the material surface, the level set function $\phi$ is defined to be "0" as given by the following equation:

$$\phi=0 \text{ (surface)} \quad (1)$$

Furthermore, the level set function is given by $\phi>0$ in a vacuum (outside the material), and by $\phi<0$ in the material.

The initial level set function is calculated by searching for the nearest position on the material surface from each mesh point and calculating the distance thereto. If the mesh point is located in the material, the sign is reversed.

Returning to FIG. 1, next, a local surface growth rate F (deposition rate or etching rate) is calculated (step S130). Here, the term "growth" includes not only deposition but also etching. Furthermore, the calculation of surface growth rate does not need to be performed for each time step. Here, instead of calculating the surface growth rate, it is also possible to calculate the flux at the material surface without conversion to the growth rate.

Subsequently, on the basis of the surface growth rate, a level set function after a lapse of time Δt is calculated (step S140). For example, the level set function is time-evolved in accordance with a discretized version of the following equation:

$$\phi_t + F|\nabla\phi| = 0 \quad (2)$$

where $\nabla$ is the vector differential operator.

Here, instead of time-evolving the profile, it is also possible to determine the surface growth rate or flux in a certain profile. This corresponds to the determination "Yes" in the first iteration of step S150 described below.

Next, it is determined whether the previously inputted process time has elapsed (step S150). If the process time has expired (step S150, yes), the final profile is outputted (step S160), and the calculation ends (step S170). If the process time has not expired (step S150, no), control returns to step S130. In this embodiment, the level set method is used as a technique for profile representation. However, any other methods such as the cell method and string method can also be used.

Figure 3:
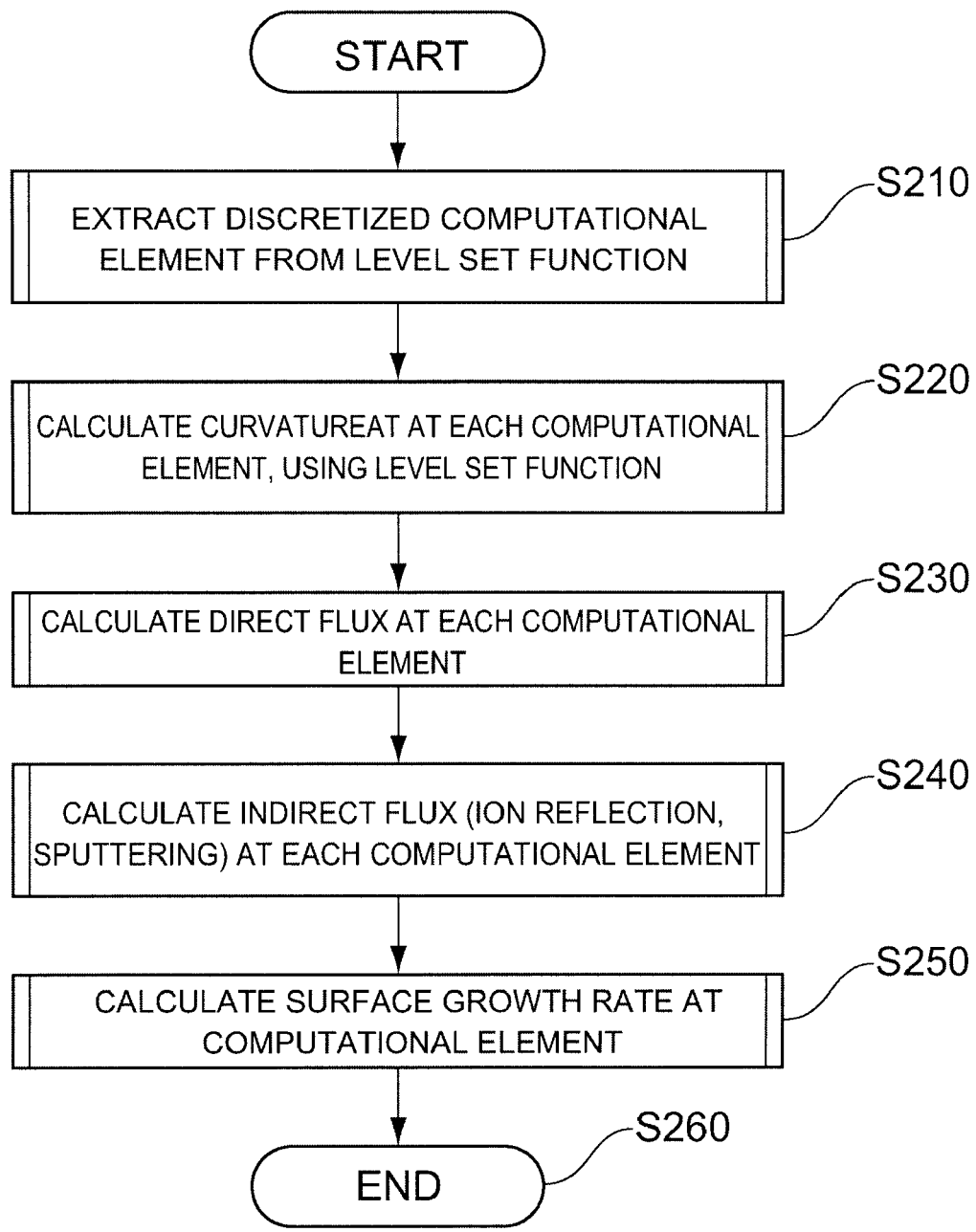
FIG. 3 is a flow chart for describing the step S130 in detail.

FIG. 3 is a flow chart for describing the content of step S130 in the flow chart of FIG. 1 in more detail.

Figure 4:
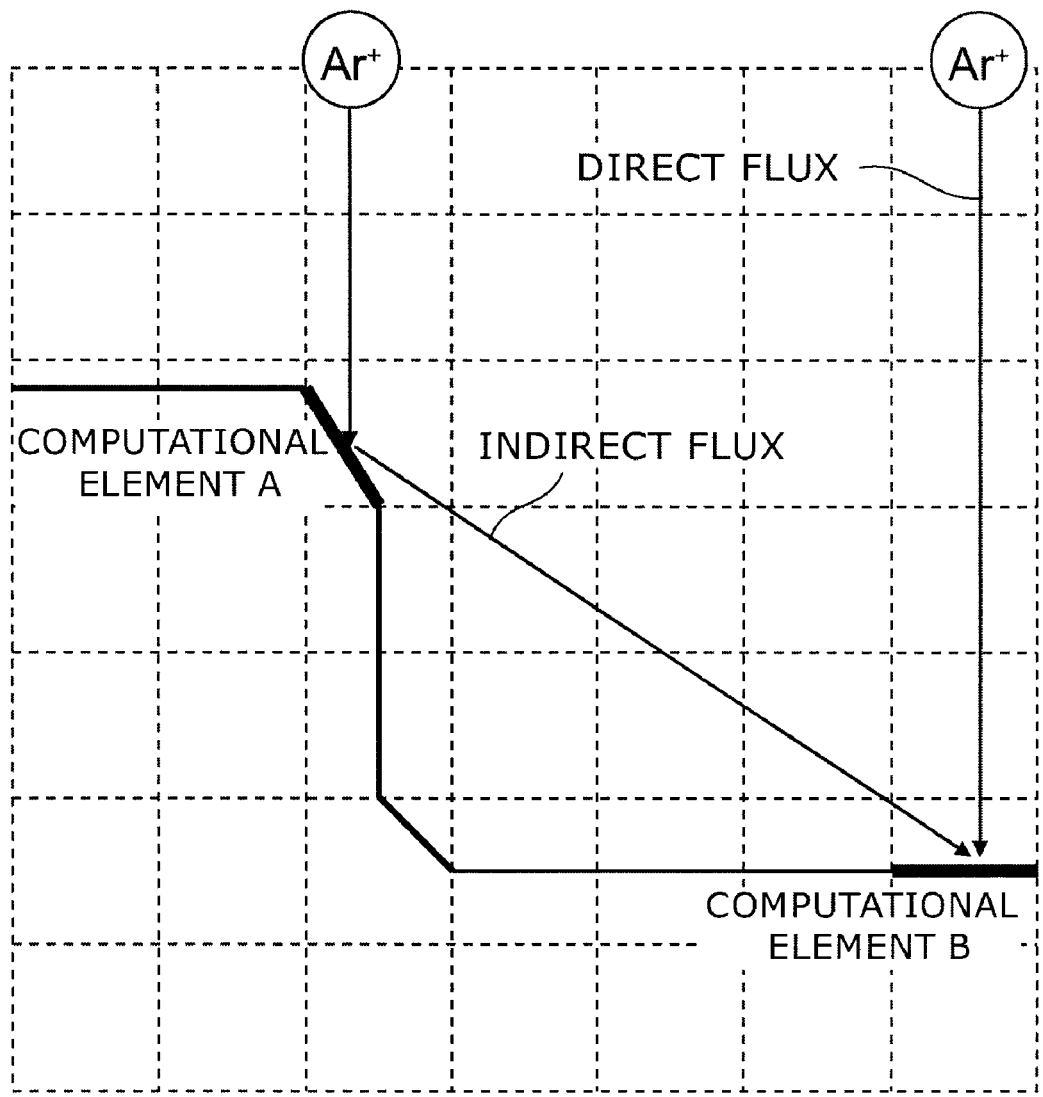
FIG. 4 is a schematic diagram illustrating a profile in which the surface profile represented by the level set method is divided into finite computational elements.

FIG. 4 is a schematic diagram illustrating a profile in which the surface profile represented by the level set method is divided into finite computational elements.

Figure 5:
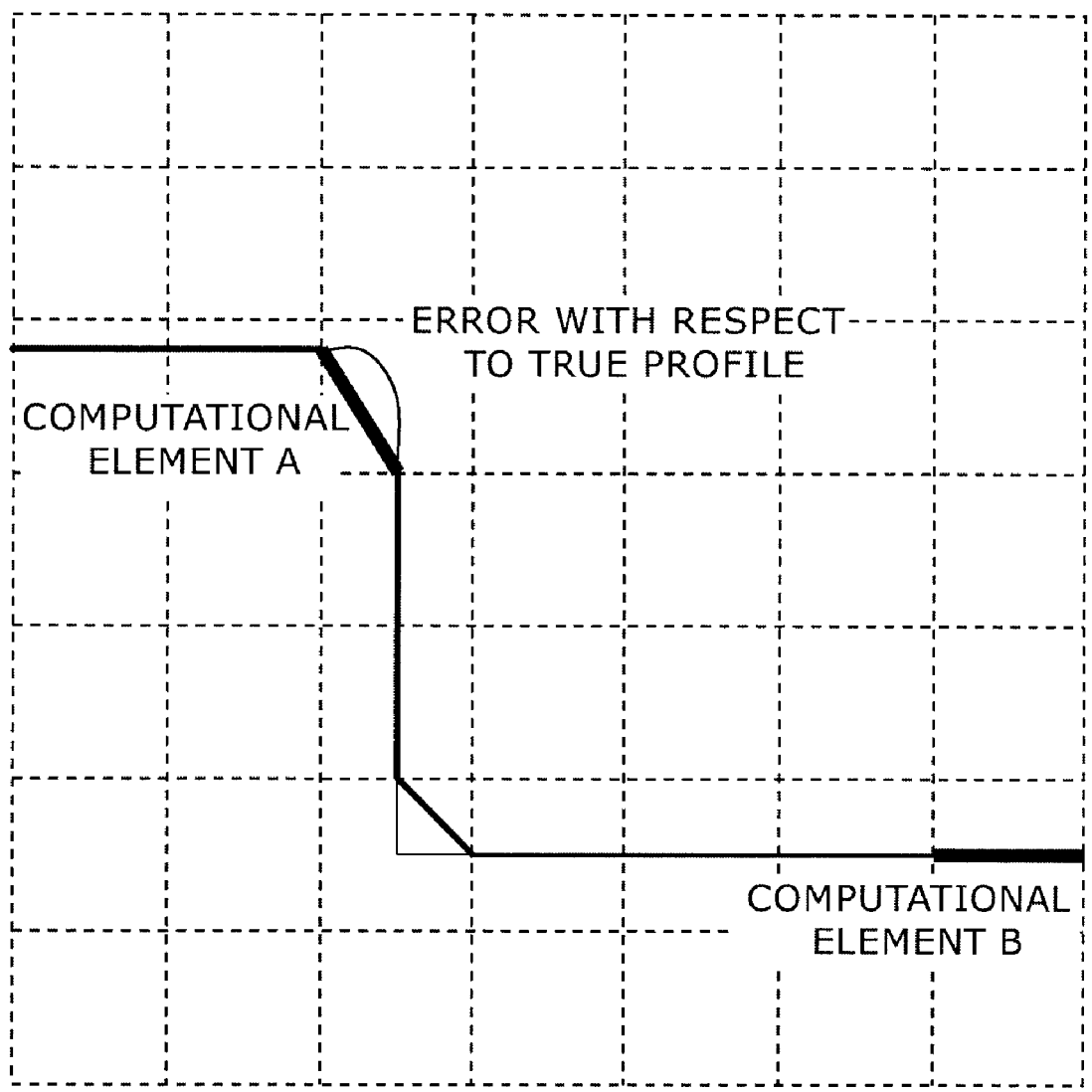
FIG. 5 is a schematic diagram illustrating the error between the profile divided into finite computational elements and the actual profile.

FIG. 5 is a schematic diagram illustrating the error between the profile divided into finite computational elements and the actual profile.

First, the surface profile represented by the level set method is divided into finite computational elements (step S210). The result of this division in step S210 is illustratively as shown in FIG. 4. Finiteness of the division into computational elements induces error between the profile divided into computational elements and the actual profile, as in the profile shown in FIG. 5. This is because the actual profile to be represented by a curve is linearly interpolated. Here, the thick solid line represents the profile divided into computational elements, and the thin solid line represents the actual profile.

It is noted that the division into computational elements is not limited to the mesh-based method, but any methods can be used. Furthermore, the division into computational elements does not need to be performed for each time step as in the flow chart shown in FIG. 3, but can be performed, for example, immediately after the input of the initial structure of step S110 in the flow chart shown in FIG. 1.

In the profile shown in FIG. 4, segments in the two-dimensional structure are used as computational elements. However, the analysis of this technique is not limited to two-dimensional or three-dimensional objects. Hence, the computational elements can be any of points, segments, and polygons.

In the profile shown in FIG. 5, determination of the flux of deposition species or etching species (hereinafter illustratively referred to as "ions") at a second computational element (hereinafter referred to as "computational element B"), and the surface growth rate (deposition rate or etching rate) based on the flux, is typically modeled so that the flux of ions directly reaching the computational element B from the vapor phase, $\Gamma_{B,direct}$ (or the growth rate based thereon), is added with the flux of ions once reaching another computational element (hereinafter referred to as "computational element a") from the vapor phase and then indirectly reaching the computational element B, $\Gamma_{a,B,indirect}$ (or the growth rate based thereon), summed for all the computational elements. This is given by the following equation:

$$\Gamma_B = \Gamma_{B,direct} + \sum_{a=1}^{A} \Gamma_{a,B,indirect} \quad (3)$$

Returning to FIG. 3, next, the level set function is used to calculate curvature at each computational element (step S220). For example, on the basis of the surface profile around the computational element A shown in FIG. 5, the surface profile at the computational element A is corrected to a surface with a curvature as represented by the thin solid line.

Subsequently, the direct ion flux at each computational element is calculated (step S230). The direct ion flux corresponds to the direct ion flux $\Gamma_{B,direct}$ in equation (3). The direct ion flux is illustratively determined by integrating the ion flux reaching from all angular directions as given by the following equation:

$$\Gamma_B = \int_\theta \int_\phi d\Gamma_{B,direct}(\theta,\phi) \quad (4)$$

Next, the indirect ion flux (indirect effect) at each computational element is calculated (step S240). This indirect ion flux corresponds to the indirect ion flux $\Gamma_{a,B,indirect}$ in equation (3). The indirect ion flux is modeled as the following equation in the case of the so-called "trench", which has translational symmetry in the depth direction:

$$\Gamma_{a,B,direct} = \Gamma_{a,reflect} g_{a,B} N(m_a) \frac{\cos\beta_B \cos^{m_a} \beta_a}{R_{a,B}} \Delta S_a \quad (5)$$

$\Gamma_{a,reflect}$ represents the flux reflected from the computational element a. $g_{a,B}$ represents the visibility factor for a and B. Here, the visibility factor represents whether the computational element B can be directly viewed from the computational element a. The visibility factor equals "1" if the computational element B can be directly viewed from the computational element a, and "0" if the computational element B cannot be directly viewed from the computational element a. $\beta_B$ represents the projection angle between the normal vector of the computational element B and the vector Ba. $\beta_a$ represents the projection angle between the reflection center vector of the computational element a and the vector aB. Here, the "reflection center vector" refers to the vector representing the maximum reflection intensity in the intensity distribution of reflection at the computational element a. $R_{a,B}$ represents the distance between the computational element a and the computational element B. $\Delta S_a$ represents the length of the segment of the computational element a. $N(m_a)$ represents the normalization factor. $m_a$ represents the angular distribution of reflection. Large $m_a$ indicates that the reflection vector has high directivity, whereas small $m_a$ indicates that the reflection vector is diffused.

In determining the indirect ion flux (indirect effect) from the computational element a to the computational element B using equation (5), existence of a profile error in the segment of the computational element a requires use of a representative value for $\beta_a$, hence increasing the error. In particular, the error significantly increases for reflection with large $m_a$.

Thus, in the simulation method according to this embodiment, the profile variation (structural variation) is determined as a curvature in step S220 and incorporated into the angular distribution of reflection from the computational element a. In determining the curvature in step S220, the curvature is calculated by the following equation using the local level set function:

$$\kappa = \nabla \left( \frac{\nabla \phi}{|\nabla \phi|} \right) \quad (6)$$

Alternatively, instead of using the level set function, the curvature can be calculated by the following equation using the normal vectors $(n_x, n_y, n_z)$ of the neighboring segments:

$$\kappa = \frac{\partial n_x}{\partial x} + \frac{\partial n_y}{\partial y} + \frac{\partial n_z}{\partial z} \quad (7)$$

Figure 6A:
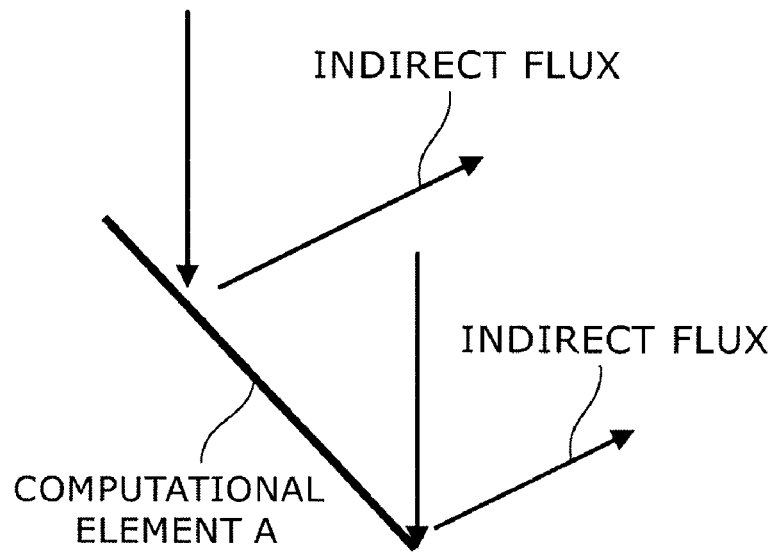
FIGS. 6A and 6B are schematic views showing the state where the structure of the computational element a includes error, and the state of the actual structure, respectively.
Figure 6B:
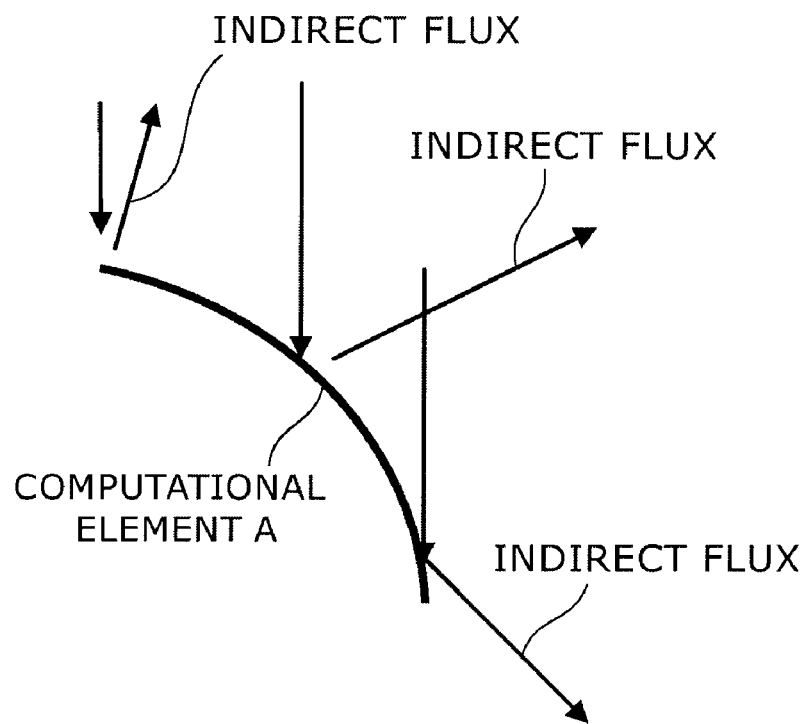

FIG. 6 is a schematic view showing the states of reflection at the computational element a, in which FIG. 6A is a schematic view showing the state where the structure of the computational element a includes error, and FIG. 6B is a schematic view showing the state of the actual structure.

In step S240, in determining the indirect ion flux from the computational element a to the computational element B using equation (5), if specular reflection occurs due to the error in the structure of the computational element a, reflection from the computational element a occurs only in a fixed direction as shown in FIG. 6A. In contrast, in the case of the actual structure, reflection from the computational element a is diffused as shown in FIG. 6B. To avoid this, in calculating the angular distribution of reflection from the first computational element (hereinafter referred to as "computational element A"), the curvature data determined earlier is used. For example, the angular distribution of reflection in equation (5) is determined by the following equation:

$$m_a = \frac{\ln(0.5)}{\ln\left(1 - \frac{(\kappa \Delta S_a)^2}{2}\right)} \quad (8)$$

In equation (8), for $\kappa=0$, $m_a$ goes to infinity, and the angular distribution of reflection approaches a flat distribution.

Let $m_{inp}$ denote the angular distribution of reflection used in the model. Then, for $m_a \geq m_{inp}$, $m_a$ is given by the following equation:

$$m_a = m_{inp} \quad (9)$$

Alternatively, a small value as given by the following equation can be substituted to avoid nonexistence of solution for $(\kappa \Delta S_a)^2 \geq 2$, i.e., for large curvature:

$$m_a = 10^{-10} \quad (10)$$

For large curvature at the computational element a, substitution of equation (10) corresponds to spreading the half-width of the angular distribution of ions emitted from the computational element a to approximate it to the actual angular distribution of reflection as shown in FIG. 6B.

Finally, the local surface growth rate $F_B$ at each computational element is determined (step S250), and the calculation ends (step S260). Let $^n\Gamma_B$ denote the local flux for reactive species n. Then, the surface growth rate is modeled by the form like the following equation, which depends on N local fluxes:

$$F_B = f(^1\Gamma_B, K, ^n\Gamma_B, K, ^N\Gamma_B) \quad (11)$$

Figure 7A:
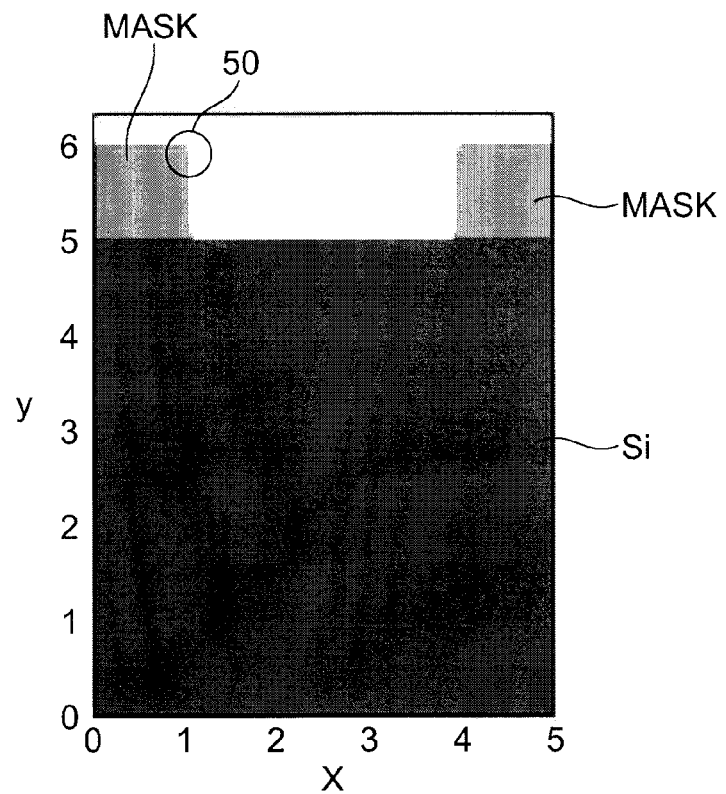
FIG. 7A is a schematic view showing the initial input profile for the simulation.
Figure 7B:
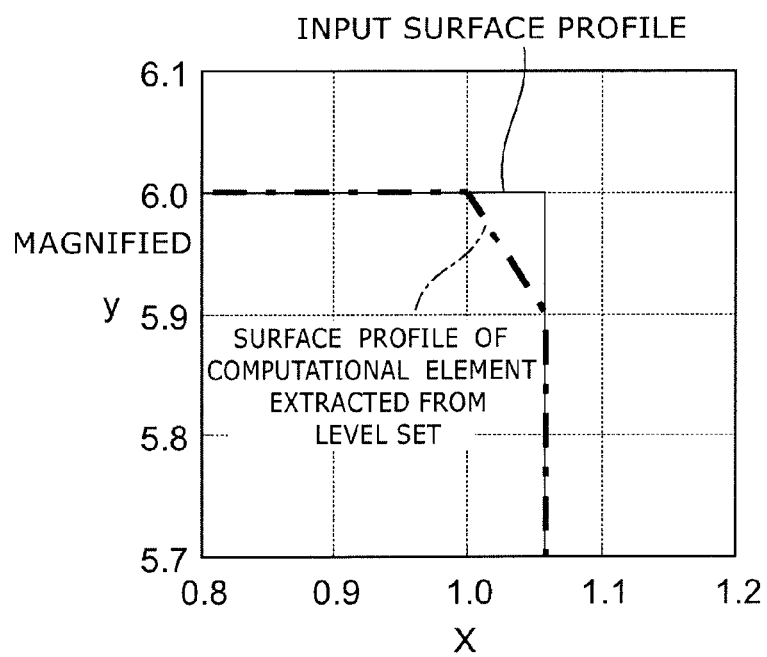
FIG. 7B is an enlarged schematic view showing the corner 50 of MASK in FIG. 7A.

FIG. 7 is a schematic view showing the condition for simulating the feature profile, in which FIG. 7A is a schematic view showing the initial input profile for the simulation, and FIG. 7B is an enlarged schematic view showing the corner 50 of MASK in FIG. 7A.

Figure 8A:
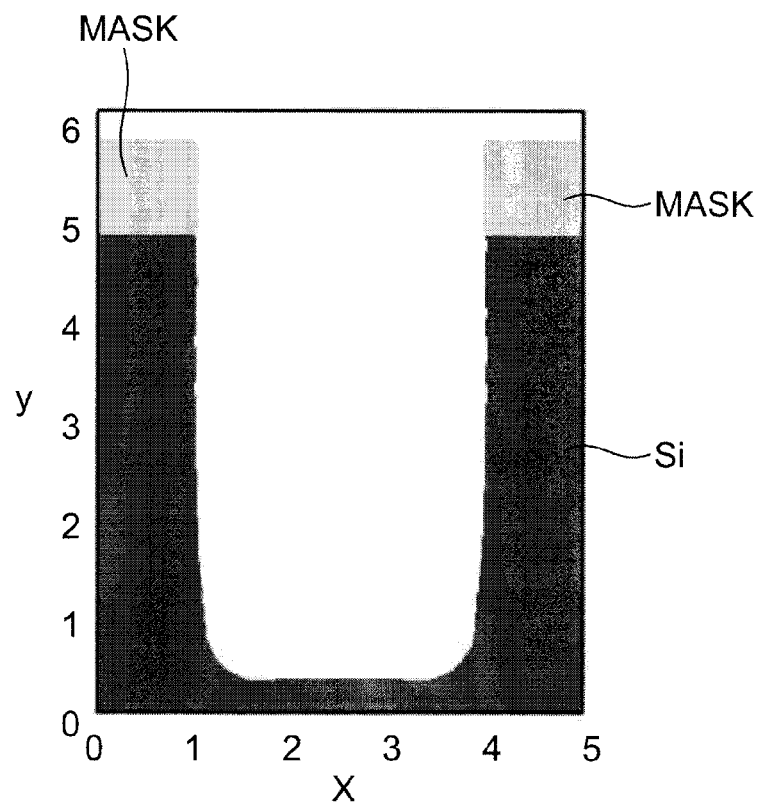
FIGS. 8A and 8B are schematic views in which the simulation method according to this embodiment and the simulation method of a comparative example are applied, respectively.
Figure 8B:
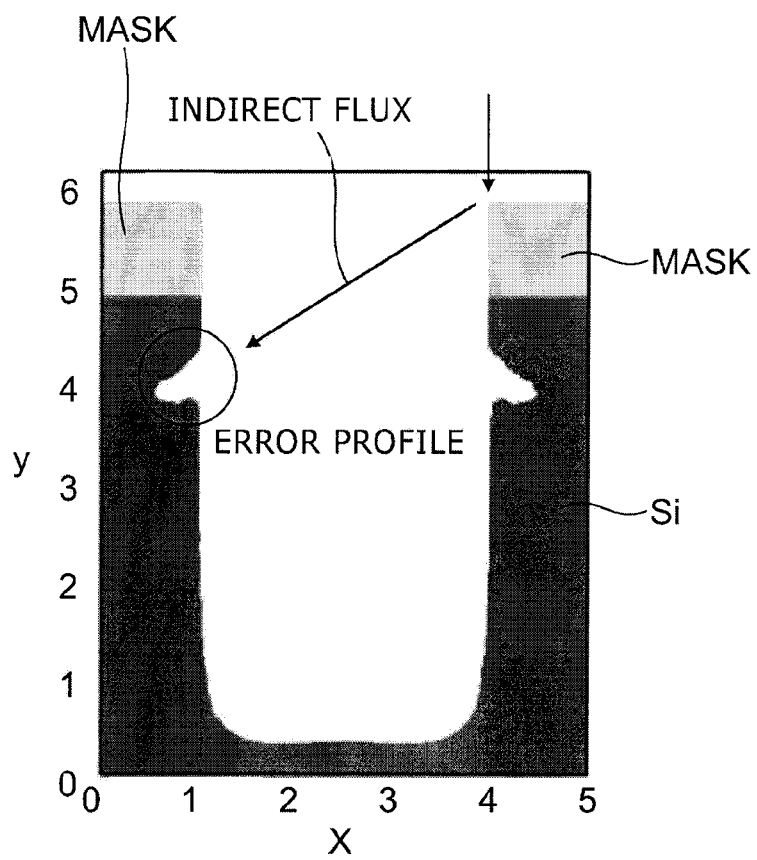

FIG. 8 is a schematic view showing the result of simulating the feature profile, in which FIG. 8A is a schematic view in which the simulation method according to this embodiment is applied, and FIG. 8B is a schematic view in which the simulation method of a comparative example is applied.

In this model, the initial input profile was a profile of silicon (Si) to be patterned by etching with a mask (MASK) having a thickness of 1 µm formed thereon. The mesh spacing was 0.1 µm in both the x-direction and y-direction. That is, silicon (Si) in FIG. 7A is divided into 50 mesh points in the x-direction.

As seen in the profile shown in FIG. 7B, there is an error between the input surface profile and the profile of the surface computational element of MASK extracted from the level set function in step S210. This model assumes that MASK is not scraped off at all in the course of processing. Argon ions (Ar$^+$) in the vapor phase are anisotropically incident on the substrate from vertically above and etch silicon. The argon ion was modeled assuming that it is reflected on MASK with the reflection probability of the following equation:

$$\Gamma_{a,reflect} = \Gamma_{a,direct} \sin \theta_{in} \quad (12)$$

$\theta_{in}$ is the incident angle of ions at each computational element. The local surface growth rate $F_B$ of silicon (Si) was modeled using the following equation so that it is determined in proportion to the local ion flux:

$$F_B = k\Gamma_B \quad (13)$$

k is a proportionality constant. $\Gamma_B$ is as determined in equation (3). Here, the default angular distribution of ion reflection, $m_{inp}$, was modeled as the following equation:

$$m_{inp} = 2000 \quad (14)$$

In the simulation based on the simulation method of the comparative example, the flux of ions reaching another computational element (e.g., computational element a) from the vapor phase and then indirectly reaching the computational element B, $\Gamma_{a,B,indirect}$, was determined from equation (5) by directly using the default angular distribution of reflection as given by the following equation for the angular distribution of reflection, $m_a$. This corresponds to the case where, in FIG. 7B, assuming that the corner 50 of the mask has a surface profile represented by the dot-dashed line, ions are reflected at this beveled portion.

$$m_a = m_{inp} \quad (15)$$

In contrast, in the simulation based on the simulation method according to this embodiment, the angular distribution of ion reflection, $m_{inp}$, was varied on the basis of the curvature using equation (8) and the like. That is, calculation was performed assuming that the corner 50 of the mask is curved.

In the simulation based on the simulation method according to this embodiment as seen in the simulation result shown in FIG. 8A, reflection is diffused in accordance with the surface curvature, and hence the error profile is significantly reduced. In contrast, in the simulation based on the simulation method of the comparative example as seen in the simulation result shown in FIG. 8B, error from the level set function in extracting computational elements produces an error profile 60 due to unreal reflection.

As described above, according to this embodiment, the data on the structural variation around the first computational element (computational element A) is determined as a curvature, and on the basis of this curvature, the indirect effect (indirect ion flux) of the first computational element (computational element A) on the second computational element (computational element B) is varied as the angular distribution of reflection. Thus, the indirect effect of the first computational element on the second computational element can be calculated more accurately, allowing simulation with a reduced error profile.

Next, a modification of this embodiment is described.

In the embodiment described with reference to FIGS. 1 to 8, reactive species reflected from the computational element a are considered. However, the flux of material sputtered by ions impinging on the computational element a can also be represented in a form similar to equation (5). For example, let $\Gamma_{a,sput}$ denote the flux of neutral species sputtered at the computational element a. Then, the sputter flux $\Gamma_{a,B,sput}$ reaching the computational element B from the computational element a is illustratively represented by the following equation:

$$\Gamma_{a,B,sput} = \Gamma_{a,sput} g_{a,B} N(m_a) \frac{\cos\beta_B \cos^{m_a}\beta_a}{R_{a,B}} \Delta S_a \quad (16)$$

Thus, the error in the angular distribution of sputtered material can also be corrected.

Next, another modification of this embodiment is described.

In the embodiment described with reference to FIGS. 1 to 8, the structural variation at the computational element a is determined as a curvature to spread the half-width of the angular distribution of reflected ions, and the angular distribution is approximated to the actual angular distribution of reflection. However, as another modeling for large curvature, the indirect flux (indirect effect) can be eliminated to reduce computation error. This is illustratively formulated as the following equation:

$$\Gamma_{a,B,direct} = \left(1 - \frac{(\kappa\Delta S_a)^2}{2}\right) \Gamma_{a,reflect} g_{a,B} N(m_{inp}) \frac{\cos\beta_B \cos^{m_{inp}}\beta_a}{R_{a,B}} \Delta S_a \quad (17)$$

According to this modeling, the indirect flux from computational elements with large curvature, which increases error, can be neglected. Although this modification is not based on physical modeling, it is useful in eliminating error.

Next, still another modification of this embodiment is described.

In the embodiment described with reference to FIGS. 1 to 8, the structural variation at the computational element a is determined as a curvature. However, any data other than curvature can be used as long as the data on the structural variation is saved. For example, the variation in the normal vector ($n_x$, $n_y$, $n_z$) can be saved as the following equation:

$$dn = \left(\frac{\partial n_x}{\partial x}, \frac{\partial n_y}{\partial y}, \frac{\partial n_z}{\partial z}\right) \quad (18)$$

This amount of variation in the normal vector can be incorporated into the angular distribution for formulation in the following equation:

$$m_a = m(dn) \quad (19)$$

Next, still another modification of this embodiment is described.

In the embodiment described with reference to FIGS. 1 to 8, the flux reflected only once is considered. However, the flux reflected a plurality of times can be formulated likewise. In a known technique for addressing such cases, the effects between all the computational elements are incorporated into a matrix, and a linear first-order equation is solved. This technique is also applicable to this modification. The formulation depending on the curvature of the computational element for each geometrical factor is implemented by the following equation:

$$A' \vec{F}_{total} = \vec{F}_{direct} \quad (20)$$

$$\vec{F}_{total} = \begin{bmatrix} \Gamma_1 \\ \Gamma_2 \\ \vdots \\ \Gamma_\psi \\ \vdots \\ \Gamma_\Psi \end{bmatrix} \quad (21)$$

$$\vec{F}_{direct} = \begin{bmatrix} \Gamma_{direct,1} \\ \Gamma_{direct,2} \\ \vdots \\ \Gamma_{direct,\psi} \\ \vdots \\ \Gamma_{direct,\Psi} \end{bmatrix} \quad (22)$$

$$A' = \begin{bmatrix} 1 & -\gamma'_{12} & \cdots & -\gamma'_{1\phi} & \cdots & -\gamma'_{1\Phi} \\ -\gamma'_{21} & 1 & \cdots & -\gamma'_{2\phi} & \cdots & -\gamma'_{2\Phi} \\ \vdots & \vdots & \ddots & \vdots & \cdots & \vdots \\ -\gamma'_{\psi 1} & -\gamma'_{\psi 2} & \cdots & 1 & \cdots & -\gamma'_{\psi\Phi} \\ \vdots & \vdots & \vdots & \vdots & \ddots & \vdots \\ -\gamma'_{\Psi 1} & -\gamma'_{\Psi 2} & \cdots & -\gamma'_{\Psi\phi} & \cdots & 1 \end{bmatrix} \quad (23)$$

$$\gamma'_{\psi\phi} = g_{\psi\phi} r_\psi N(m_\psi) \frac{\cos\beta_\phi \cos^{m_\psi}\beta_\psi}{R_{\psi\phi}} \Delta S_\psi \quad (24)$$

$$m_\psi = \frac{\ln(0.5)}{\ln\left(1 - \frac{(\kappa \Delta S_\psi)^2}{2}\right)} \quad (25)$$

$F_{total}$ is the vector representing the solution flux. $F_{direct}$ is the vector representing the direct flux. $r_\psi$ is the reflection probability at each computational element. As described above, the geometrical factor $\gamma'_{\psi\phi}$ can be expressed in a form dependent on the curvature of each computational element to represent the phenomenon of infinitely repeated reflections.

Next, still another modification of this embodiment is described.

This embodiment is also applicable to techniques based on the Monte Carlo method. In such techniques, the angular distribution of the reflection of particles reaching a computational element A is made dependent on the curvature of the computational element A to stochastically vary the reflecting direction.

Next, a second embodiment of the invention is described.

Figure 9:
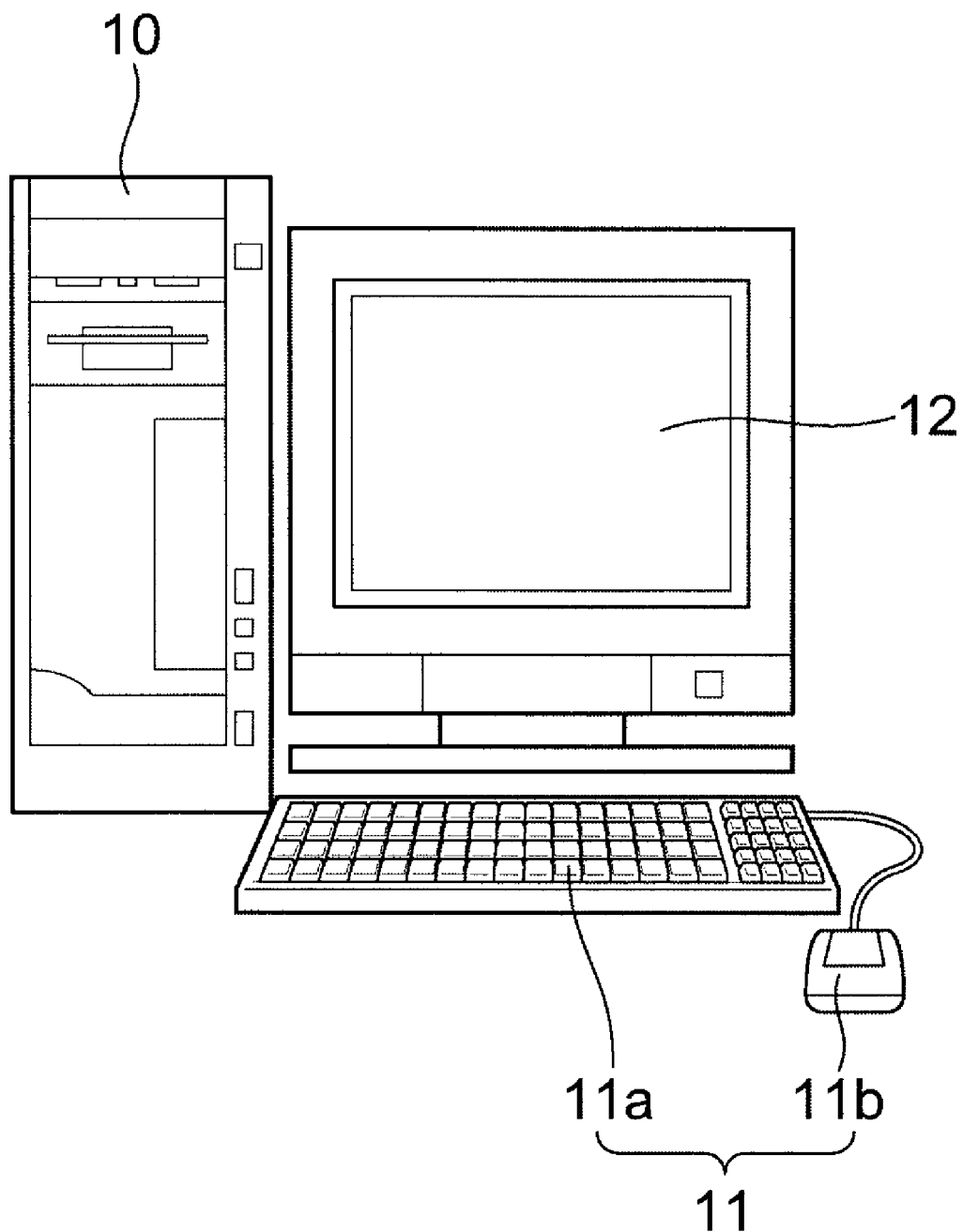
FIG. 9 is a schematic view showing a simulation apparatus loaded with a simulation program according to a second embodiment of the invention.

FIG. 9 is a schematic view showing a simulation apparatus loaded with a simulation program according to the second embodiment of the invention.

The simulation apparatus shown in FIG. 9 comprises a control unit 10, an input unit 11, and an output unit 12.

The control unit 10 includes a CPU (central processing unit) serving as a controller, and a ROM (read only memory) and a RAM (random access memory) serving as storage devices. The control unit 10 controls the input unit 11 and the output unit 12 and performs simulation. Upon input of prescribed instruction information from the input unit 11 by a user of the simulation apparatus, the CPU reads a simulation program and the like stored in the ROM, expands it in a program storage region in the RAM, and performs various processes including the simulation. Various data produced in these processes (simulation results) are stored in a data storage region created in the RAM.

The input unit 11 includes a keyboard 11a and a mouse 11b. Through the input unit 11, the user inputs information on calculation formulas, information on experimental and predicted values, information on the microstructure of the device, information on the flux, or instruction information (information on conditions and procedures) for performing simulation.

The output unit 12 includes display means such as a liquid crystal monitor. The output unit 12 outputs and displays the calculation results (simulation results) of the simulation calculated by the control unit 10.

As described above, the simulation apparatus loaded with a simulation program according to this embodiment comprises a control unit 10, an input unit 11, and an output unit 12. However, in addition, the simulation apparatus can further comprise a storage device such as a HDD (hard disk drive) or a CD (compact disc) drive unit.

In this case, it is also possible to provide the simulation program according to this embodiment by storing it as an installable or executable file on a computer-readable storage medium such as a CD-ROM, flexible disk (FD), CD-R, and DVD (digital versatile disk).

It is also possible to provide the simulation program according to this embodiment by storing it on a computer connected to a network such as the Internet and allowing it to be downloaded through the network. Furthermore, the simulation program according to this embodiment can also be provided or distributed through a network such as the Internet. Moreover, it is also possible to provide the simulation program according to this embodiment by preinstalling it in a ROM.

The embodiments of the invention have been described. However, the invention is not limited to the foregoing description. The above embodiments can be suitably modified by those skilled in the art without departing from the spirit of the invention, and any such modifications are also encompassed within the scope of the invention. For example, the techniques described in relation to the embodiments of the invention are applicable not only to simulating the surface processing of semiconductor devices, but also to simulating the surface processing in general. For example, such techniques are also applicable to simulations for processing MEMS (microelectromechanical systems) and display devices.

The elements included in the above embodiments can be combined with each other as long as technically feasible without departing from the spirit of the invention, and such combinations are also encompassed within the scope of the invention.

The invention claimed is:

1. A simulation method comprising:
dividing a material surface into finite computational elements using a computer; and
calculating a rate of one of deposition and etching at each of the computational elements to simulate a feature profile of the material surface using the computer, the calculating including calculating an indirect effect of a first computational element on the rate at a second computational element, the calculating the indirect effect including:
correcting a surface profile at the first computational element on the basis of a surface structure around the first computational element using a level set method; and calculating the indirect effect on the basis of the corrected surface profile at the first computational element, wherein the correction of the surface profile includes approximating at least part of the surface profile at the first computational element to a curved surface which is continuous to the surface around the first computational element.

2. The method according to claim 1, wherein the indirect effect is a flux of species reflected at the first computational element and reaching the second computational element.

3. The method according to claim 1, wherein the indirect effect is a component of a rate for species reflected at the first computational element and reaching the second computational element.

4. The method according to claim 3, wherein the calculating the indirect effect includes calculating an angular distribution of species reflected at the first computational element.

5. The method according to claim 1, wherein the indirect effect is a flux of sputtered material which is sputtered by species impinging on the first computational element and reaches the second computational element.

6. The method according to claim 1, wherein the indirect effect is a component of a rate for sputtered material which is sputtered by species impinging on the first computational element and reaches the second computational element.

7. The method according to claim 6, wherein the calculating the indirect effect includes calculating an angular distribution of the sputtered material which is sputtered at the first computational element.

8. The method according to claim 1, wherein the correction of the surface profile includes approximating the curved surface with a normal vector.

9. A simulation method comprising:
dividing a material surface into finite computational elements using a computer; and calculating a rate of one of deposition and etching at each of the computational elements to simulate a feature profile of the material surface using the computer, the calculating including calculating an indirect effect on the rate at one computational element exerted by all the other computational elements, the calculating the indirect effect including:
correcting a surface profile at the all the other computational elements on the basis of a surface structure around each of the all the other computational elements using a level set method; and calculating the indirect effect for a plurality of reflections on the basis of the corrected surface profile at the all the other computational elements, wherein the correction of the surface profile includes approximating at least part of the surface profile of at least one of the all the other computational elements to a curved surface which is continuous to the surface around the one of the all the other computational elements.

10. The method according to claim 9, wherein geometrical factors at the at least one of the all the other computational elements are expressed in a form dependent on the curvature of the curved surface.

11. A simulation program configured to cause a computer to perform a simulation, the simulation including:
dividing a material surface into finite computational elements; and calculating a rate of one of deposition and etching at each of the computational elements to compute a feature profile of the material surface, the calculating including calculating an indirect effect of a first computational element on the rate at a second computational element, in calculating the indirect effect, the simulation program causing the computer to perform:
correcting a surface profile at the first computational element on the basis of a surface structure around the first computational element using a level set method; and calculating the indirect effect on the basis of the corrected surface profile at the first computational element, wherein the correction of the surface profile includes approximating at least part of the surface profile at the first computational element to a curved surface which is continuous to the surface around the first computational element.

12. The program according to claim 11, wherein the indirect effect is a flux of species reflected at the first computational element and reaching the second computational element.

13. The program according to claim 11, wherein the indirect effect is a component of a rate for species reflected at the first computational element and reaching the second computational element.

14. The program according to claim 13, wherein the calculating the indirect effect includes calculating an angular distribution of species reflected at the first computational element.

15. The program according to claim 11, wherein the indirect effect is a flux of sputtered material which is sputtered by species impinging on the first computational element and reaches the second computational element.

16. The program according to claim 11, wherein the indirect effect is a component of a rate for sputtered material which is sputtered by species impinging on the first computational element and reaches the second computational element.

17. The program according to claim 16, wherein the calculating the indirect effect includes calculating an angular distribution of the sputtered material which is sputtered at the first computational element.

18. The program according to claim 11, wherein the correction of the surface profile includes approximating the curved surface with a normal vector.

* * * * *